United States Patent
Sasaki et al.

[11] Patent Number: 5,845,030
[45] Date of Patent: Dec. 1, 1998

[54] SEMICONDUCTOR LASER MODULE AND OPTICAL FIBER AMPLIFIER

[75] Inventors: Goro Sasaki; Atsushi Hamakawa, both of Yokohama, Japan

[73] Assignee: Sumitomo Electric Industries, Ltd., Osaka, Japan

[21] Appl. No.: 831,254

[22] Filed: Apr. 8, 1997

[30] Foreign Application Priority Data

Apr. 8, 1996 [JP] Japan .................................. 8-085289

[51] Int. Cl.[6] .................................................. G02B 6/36
[52] U.S. Cl. ............................. 385/88; 385/93; 385/37; 372/102
[58] Field of Search ................................. 385/88–94, 12, 385/37, 123; 372/6, 18, 20, 43, 49, 92, 96, 102, 107, 108; 250/227.11, 227.13, 227.23, 227.24

[56] References Cited

U.S. PATENT DOCUMENTS

| | | | |
|---|---|---|---|
| 5,485,481 | 1/1996 | Ventrudo et al. | 372/6 |
| 5,659,559 | 8/1997 | Ventrudo et al. | 385/10 X |
| 5,699,377 | 12/1997 | Pan | 385/37 X |

*Primary Examiner*—Phan T. H. Palmer
*Attorney, Agent, or Firm*—Cushman Darby & Cushman IP Group of Pillsbury Madison & Sutro LLP

[57] ABSTRACT

A semiconductor laser module includes a semiconductor laser having an active region between a light-reflecting surface and a light-exit surface thereof, and an optical fiber optically coupled to the semiconductor laser and including an optical fiber diffraction grating. The optical fiber diffraction grating selectively reflects light within a predetermined wavelength band. The wavelength band has a width larger than a wavelength interval of a longitudinal mode of light resonating between the light-reflecting surface and the light-exit surface.

14 Claims, 8 Drawing Sheets

SEMICONDUCTOR LASER MODULE AND OPTICAL FIBER AMPLIFIER

BACKGROUND OF THE INVENTION

1. Field of the Invention

The present invention relates to a semiconductor laser module for outputting a laser beam, and an optical fiber amplifier.

2. Related Background Art

An optical fiber amplifier is known as an apparatus that guides an input signal beam and an excitation beam into an amplification fiber simultaneously to amplify the signal beam. As a semiconductor laser is small and has a high output, it is used as an excitation light source in such an optical fiber amplifier.

SUMMARY OF THE INVENTION

A semiconductor laser module in which an optical fiber diffraction grating is made to oppose a semiconductor laser emits a laser beam having as a resonator length the distance between the light-reflecting surface of the semiconductor laser and the optical fiber diffraction grating. A laser beam having as a resonator length the distance between the light-reflecting and light-exit surfaces of the semiconductor laser itself is also generated. Accordingly, the laser beam emitted from the semiconductor laser module has two oscillation spectra determined by these resonator lengths. The peak value of the oscillation spectrum of the laser beam having as the resonator length the distance between the light-reflecting and light-exit surfaces of the semiconductor laser itself shifts in accordance with a temperature change. When the peak value of one oscillation spectrum shifts to overlap the peak value of the other oscillation spectrum, the output of the resultant overlapping laser beam changes largely. When the optical output of the semiconductor laser changes in this manner, the gain of the signal beam in the optical fiber amplifier changes greatly, so the gain of the signal beam cannot be controlled sufficiently.

Thus, the semiconductor laser module according to the present invention comprises a semiconductor laser having an active region between a light-reflecting surface and a light-exit surface thereof; and an optical fiber optically coupled to the semiconductor laser and including an optical fiber diffraction grating, the optical fiber diffraction grating serving to selectively reflect light within a predetermined wavelength band, the wavelength band having a width larger than a wavelength interval of a longitudinal mode of light resonating between the light-reflecting surface and the light-exit surface.

In this case, since the width of the wavelength band of light reflected by the optical fiber diffraction grating is larger than the wavelength interval of the longitudinal mode of light resonating between the light-reflecting surface and the light-exit surface, even if the peak value of the oscillation spectrum of light resonating between the light-reflecting and the light-exit surface shifts, the intensity of the laser beam output from this module does not change extremely. Accordingly, if this module is used as the excitation light source for an optical fiber amplifier, the gain of a signal beam can be controlled sufficiently.

In particular, when this semiconductor laser comprises a semiconductor laser for emitting light within a 1.48-$\mu$m band, if the width of the wavelength band is set from 2 nm to 5 nm, a great change in gain in signal beam can be prevented while a sufficient gain required for an optical fiber amplifier is maintained.

The shift of the oscillation spectrum depends on a change in temperature of the laser caused by a change in current injected to the semiconductor laser. Since the module according to the present invention further comprises a package having the semiconductor laser arranged therein; and a Peltier element thermally connected to the semiconductor laser and arranged in the package, the temperature of the semiconductor laser can be controlled by the Peltier element.

Since this semiconductor laser module further comprises a heat sink arranged between the Peltier element and the semiconductor laser and fixed to the Peltier element and the semiconductor laser, a change in temperature of the semiconductor laser can be further suppressed.

If this semiconductor laser module has a first lens arranged to oppose the light-exit surface of the semiconductor laser, and if the heat sink has an opening located between the light-exit surface of the semiconductor laser and the first lens, the first lens can be fixed to the semiconductor lens by only fixing the first lens to the heat sink.

The end portion of the optical fiber on the semiconductor laser side may be substantially spherical. The optical fiber may have a core with a diameter that increases toward the semiconductor laser.

This semiconductor laser module further comprises an antireflection coating having a reflectance of 1% or less and formed on the light-exit surface of the semiconductor laser. The antireflection coating is preferably a dielectric multilayer film. This dielectric multilayer film contains at least two materials selected from the group consisting of $SiO_2$, $TiO_2$, $SiN$, $Al_2O_3$, $MgF_2$, and amorphous silicon.

The laser beam output emitted from the semiconductor laser module changes when the position of the light-exit surface, the first lens, the second lens, or the optical fiber diffraction grating changes. Hence, this semiconductor laser module comprises a first lens arranged in the package to oppose the light-exit surface of the semiconductor laser; and a second lens arranged outside the package to oppose the first lens, wherein positions of the light-exit surface, the first lens, the second lens, and the optical fiber diffraction grating are fixed.

In order to maintain the airtightness of the package, this semiconductor laser module further comprises a hermetic glass member formed in the package. The hermetic glass member may be interposed between the semiconductor laser and the optical fiber diffraction grating.

An optical fiber amplifier using the semiconductor laser module described above comprises an erbium-doped fiber; and a wavelength multiplexer/demultiplexer for optically coupling the semiconductor laser and the erbium-doped fiber to each other through the optical fiber.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 9:
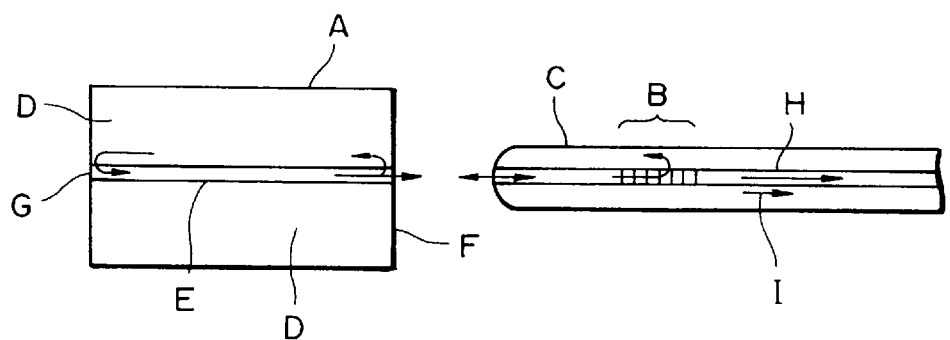
FIG. 9 is a schematic view of a semiconductor laser module to be compared with the present invention.

A semiconductor laser module to be compared with the present invention will first be described so that a semiconductor laser module according to the present invention can be understood easily. As a semiconductor laser module to be compared with the present invention that outputs a laser beam, one as shown in FIG. 9 is possible in which an optical fiber C formed with a diffraction grating B is arranged at a predetermined distance from a semiconductor light-emitting element A. In the semiconductor light-emitting element A of this semiconductor laser module, an active region E is formed between cladding layers D, and a light-exit surface F and a light-reflecting surface G are formed on the end faces of the active region E. The light-exit surface F opposes the optical fiber C and forms a low-reflecting surface having a low reflectance. The light-reflecting surface G opposes this light-exit surface F and forms a high-reflecting surface having a high reflectance. The diffraction grating B is formed in the optical fiber C by forming a plurality of regions having a high refractive index at a predetermined pitch in the core serving as a light guide. The diffraction grating B is disposed at a predetermined distance from the light-exit surface F of the semiconductor element A. In this semiconductor laser module, the active region E generates light upon current injection to the semiconductor light-emitting element A. The light is amplified as it is reflected between the light-reflecting surface G and the diffraction grating B. Hence, a laser beam H having a single wavelength determined by the pitch width of the diffraction grating B is output from this semiconductor laser module through the optical fiber C.

Figure 10:
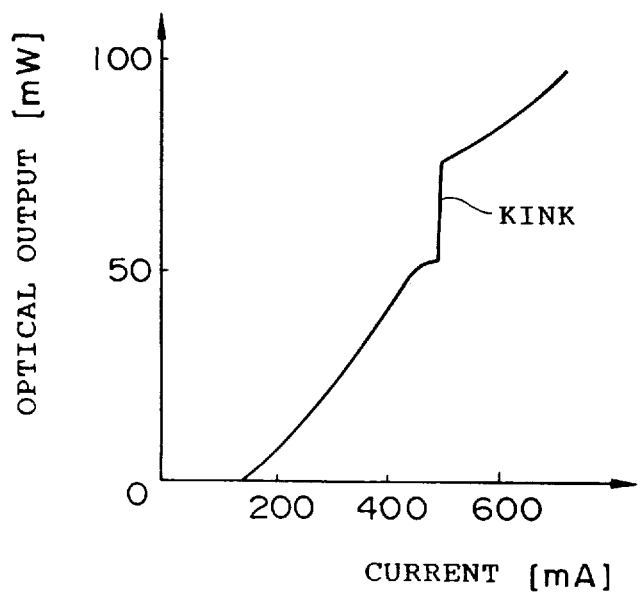
FIG. 10 is a graph showing the output characteristics of the laser beam of the semiconductor laser module to be compared with the present invention.

However, the semiconductor laser module described above which is be compared with the present invention has drawbacks as follows. As shown in FIG. 9, part of light generated in the semiconductor light-emitting element A does not emerge completely from the light-exit surface F, but is reflected by the light-exit surface F, reciprocally amplified between the light-exit surface F and the light-reflecting surface G, and output as a weak laser beam I. Therefore, the oscillation state of the desired laser beam H output in accordance with reflection amplification between the light-reflecting surface G and the diffraction grating B is influenced by the oscillation of this extra weak laser beam I, and causes a kink (non-linear range) in the characteristics of the optical output with respect to the injection current, as shown in FIG. 10. Accordingly, the optical output of the semiconductor laser module cannot be stably controlled.

The present invention has been made in order to solve the above problem, and has as its object to provide a semiconductor laser module capable of stably controlling its optical output.

According to the present invention, there is provided a semiconductor laser module characterized by comprising a semiconductor light-emitting element formed with a light-reflecting surface and a light-exit surface opposing each other through an active region, and an optical fiber which is optically coupled to the light-exit surface of the semiconductor light-emitting element such that the optical fiber can output and input light to and from the light-exit surface of the semiconductor light-emitting element and which has a diffraction grating formed therein to reflect only light having a predetermined wavelength. Upon current injection to the semiconductor light-emitting element, light is generated in the active region. This light is reflected to be amplified between the light-reflecting surface and the diffraction grating, and is output as a laser beam. The reflection wavelength band width of the diffraction grating is set larger than the wavelength interval of the longitudinal mode of light resonating between the light-reflecting surface and the light-exit surface of the semiconductor light-emitting element.

With this module, even if the wavelength of the longitudinal mode of light resonating between the light-reflecting surface and the light-exit surface of the semiconductor light-emitting element varies due to an increase in injection current to the semiconductor light-emitting element and the like, this variation does not largely influence the oscillation state of the laser beam which is oscillated based on the reflection characteristics of the diffraction grating. Thus, occurrence of a non-linearity (kink) is prevented in the characteristics of the optical output of this laser beam with respect to the injection current.

This module is also characterized in that the semiconductor light-emitting element is a 1.48-$\mu$m band laser diode chip and that the reflection band width of the diffraction grating is 2 nm or more.

Since the semiconductor light-emitting element of this module is the 1.48-$\mu$m band laser diode chip and the resonator length of the laser diode chip is 300 to 900 $\mu$m, the wavelength interval of the longitudinal mode described above becomes 0.3 to 1 nm. Since the reflection band width of the diffraction grating is 2 nm or more, a plurality of longitudinal modes exist in the oscillation wavelength band of the laser beam. Even if the wavelength of these longitudinal modes varies, this variation does not largely influence the oscillation state of the laser beam. As a result, occurrence of a non-linearity (kink) in the characteristics of the optical output of the laser beam with respect to the injection current is prevented.

This module is also characterized in that the diffraction grating has a reflection band width of 2 nm to 5 nm.

With this module, occurrence of a kink in the characteristics of the optical output of the laser beam with respect to the injection current can be prevented, as described above, and the laser beam can have a narrow spectrum band. Therefore, this module is useful as an excitation light source in an optical amplifier using an erbium-doped fiber.

This module is also characterized in that the light-exit surface of the semiconductor light-emitting element is formed with an antireflection coating having a reflectance of 1% or less.

In this module, since resonance of light between the light-reflecting surface and the light-exit surface of the semiconductor light-emitting element is suppressed, occurrence of a non-linearity (kink) in the characteristics of the optical output of the laser beam with respect to the injection current is prevented effectively.

This module is also characterized by comprising a package for accommodating a semiconductor light-emitting element, a Peltier element arranged in the package to perform temperature control of the semiconductor light-emitting element, a hermetic glass member formed in the side wall of the package to allow propagation of light between the inside and outside of the package, a ferrule mounted on the outer side of the package to hold an optical fiber, and a lens system serving to increase the optical coupling efficiency between the semiconductor light-emitting element and the optical fiber and constituted by a first lens formed in the package to perform optical coupling on the semiconductor light-emitting element side and a second lens disposed outside the package to perform optical coupling on the optical fiber side. This module is also characterized by comprising a package for accommodating a semiconductor light-emitting element, a Peltier element arranged in the package to perform temperature control of the semiconductor light-emitting element, a hermetic glass member formed in the side wall of the package to allow propagation of light between the inside and outside of the package, a ferrule mounted on the outer side of the package to hold an optical fiber, and a lens system serving to increase the optical coupling efficiency between the semiconductor light-emitting element and the optical fiber, disposed in the package, and having a function of focusing light toward the semiconductor light-emitting element and a function of focusing light toward the optical fiber. This module is also characterized by comprising a package for accommodating a semiconductor light-emitting element, and a Peltier element arranged in the package to perform temperature control of the semiconductor light-emitting element. One end of the optical fiber is disposed through the package and is optically coupled to the semiconductor light-emitting element arranged in the package.

The above module can be applied to the existing semiconductor laser module.

This module is also characterized in that the distal end of the optical fiber is formed spherical. With this module, the coupling efficiency with the semiconductor light-emitting element is increased.

This module is also characterized in that the diameter of the core of the optical fiber is increased toward the end portion. With this module, a decrease in coupling efficiency with the semiconductor light-emitting element caused by a position error of the optical fiber is prevented.

Various preferred embodiments of the present invention will be described with reference to the accompanying drawings. In the drawings, the identical elements are denoted by the same reference numerals, and a detailed description thereof will be omitted. The dimensional proportion in the drawings do not necessary coincide with those of the embodiments explained.

(First Embodiment)

Figure 1:
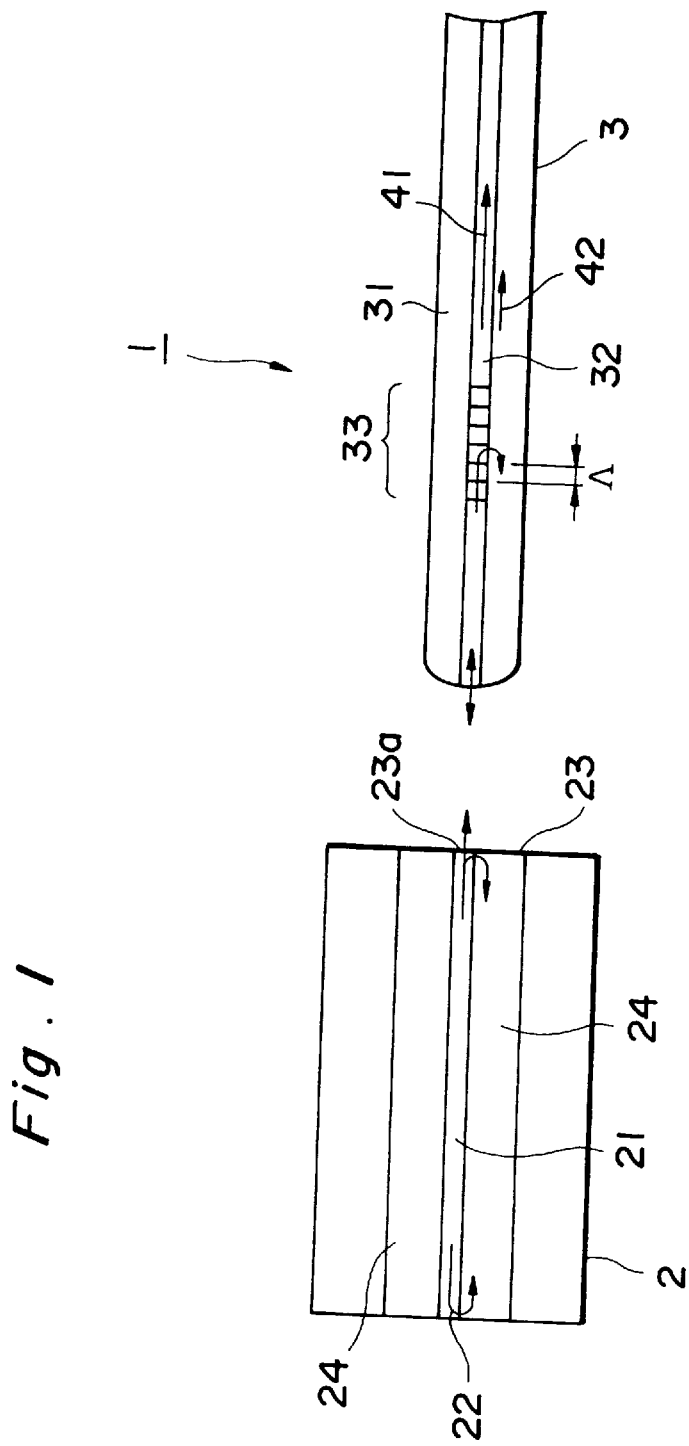
FIG. 1 is a schematic view of a semiconductor laser module.

FIG. 1 is a schematic view of a semiconductor laser module 1. Referring to FIG. 1, the semiconductor laser module 1 has a semiconductor light-emitting element (semiconductor laser) 2 and an optical fiber 3. The semiconductor light-emitting element 2 has an active region 21 for generating and amplifying light, and is formed with a light-reflecting surface 22 and a light-exit surface 23 that oppose each other through the active region 21. When a current is injected to the active region 21, the semiconductor light-emitting element 2 generates and amplifies light. This light is reflected by the light-reflecting surface 22 and emerges from the light-exit surface 23. As the semiconductor light-emitting element 2, for example, a Fabry-Perot laser diode chip having an InGaAsP/InP double heterostructure is used. The active region 21 made of InGaAsP is formed between cladding layers 24 made of InP. As the semiconductor light-emitting element 2, for example, one having an oscillation wavelength falling within a 1.48-$\mu$m band (1,480 nm±50 nm) is used. In this case, the laser module 1 can be utilized as the excitation light source for an optical amplifier.

As a means for injecting a current to the semiconductor light-emitting element 2, for example, a current-injecting drive circuit (not shown) is connected to the semiconductor light-emitting element 2. It suffices as far as a current can be supplied to the active region 21 through the cladding layers 24. When a predetermined current is injected by such a drive circuit to the semiconductor light-emitting element 2, the cladding layers 24 and the active region 21 are excited to generate spontaneous emission light. This spontaneous emission light propagates in the active region 21 while causing induced emission, and emerges from the light-exit surface 23 together with the induced emission light. The semiconductor light-emitting element 2 is not limited to the above-described one having the InGaAsP/InP double heterostructure, but can be one made of any other semiconductor or the like as far as it generates and amplifies light and has a light-reflecting surface 22 and a light-exit surface 23 identical to those described above. The semiconductor light-emitting element 2 is not limited to one having the 1.48-$\mu$m band, but can be one that oscillates a laser beam at other wavelengths.

An antireflection coating (AR coating) 23a is formed on the light-exit surface 23 of the semiconductor light-emitting element 2 to have a very low reflectance. As the antireflection coating 23a of the light-exit surface 23, for example, a dielectric multilayer film is used. The dielectric multilayer film is formed by stacking, e.g., thin silica ($SiO_2$), titania ($TiO_2$), silicon nitride (SiN), aluminum oxide ($Al_2O_3$), magnesium fluoride ($MgF_2$), amorphous silicon films. The reflectance of the antireflection coating 23a for a specific wavelength can be arbitrarily set by changing the refractive index, the thickness, and the number of layers of these films as required. It is preferable that the antireflection coating 23a of the light-exit surface 23 have a reflectance of 1% or less. With this reflectance, reflection of light by the light-exit surface 23 is suppressed, so that reflection and amplification of light between the light-reflecting surface 22 and the light-exit surface 23 to output a laser beam can be decreased.

The light-reflecting surface 22 of the semiconductor light-emitting element 2 has a very high reflectance at the oscillation wavelength. If this light-reflecting surface 22 is formed with a dielectric multilayer film in the same manner as the light-exit surface 23, it can have a high reflectance. The light-reflecting surface 22 can be a crystal cleavage surface which is formed by vapor deposition.

As shown in FIG. 1, the optical fiber 3 is arranged on the light-exit surface 23 side of the semiconductor light-emitting element 2 and is optically coupled to the light-reflecting surface 22 such that the optical fiber can output and input light to and from the light-reflecting surface 22 of the semiconductor light-emitting element 2. More specifically, the optical fiber 3 is disposed on the light-exit surface 23 side of the semiconductor light-emitting element 2 such that light emerging from the light-exit surface 23 is incident on the end face of the optical fiber 3 and light emerging from the optical fiber 3 is incident on the light-exit surface 23. The optical fiber 3 is an elongated light guide member, and a core 32 having a high refractive index is formed along the central position of a cladding 31. A diffraction grating 33 for reflecting light having a specific wavelength is formed in the core 32. The diffraction grating 33 constitutes a Fabry-Perot resonator together with the light-reflecting surface 22 of the semiconductor light-emitting element 2, and is formed by periodically changing the effective refractive index of the core 32 along the optical axis of the optical fiber 3. The reflection wavelength characteristics of light are set by the period of the effective refractive index. A reflection wavelength (Bragg wavelength) $\lambda_B$ of light reflected by the diffraction grating 33 is expressed by the following equation (1):

$$\lambda_B = 2 \cdot n_1 \cdot \Lambda \tag{1}$$

where $n_1$: the minimum refractive index of the diffraction grating 33; and $\Lambda$: the period of the diffraction grating 33

The separation of the period $\Lambda$ of the diffraction grating 33 changes gradually. Therefore, the reflection wavelength characteristics of the diffraction grating 33 have a predetermined band width. The reflection band width of the diffraction grating 33 is set to be larger than the wavelength interval of the longitudinal mode of light resonating between the light-reflecting surface 22 and the light-exit surface 23 of the semiconductor light-emitting element 2. The reflection band width of the diffraction grating 33 is a wavelength range between a long wavelength and a short wavelength at which the reflection amount is decreased to half the maximum reflection amount, and which has as the center the wavelength of light reflected at the maximum by the diffraction grating 33 when light is transmitted through the optical fiber 3 formed with the diffraction grating 33. Since the reflection band width of the diffraction grating 33 is set as described above, occurrence of a non-linearity (kink) in the characteristics of the optical output of the semiconductor laser module 1 with respect to the injection current is prevented.

Figure 2:
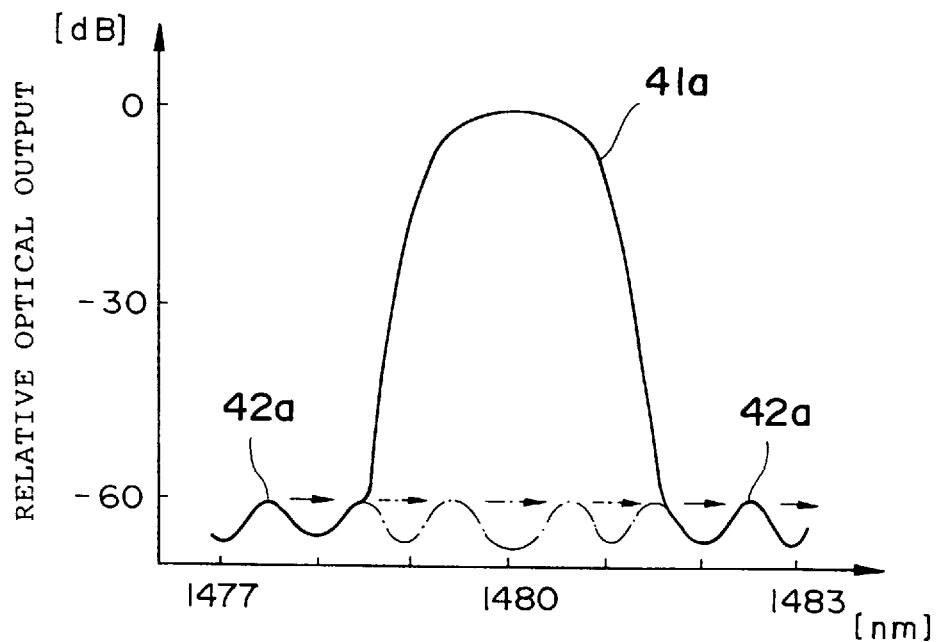
FIG. 2 is a graph showing the spectra of a laser beam output from the semiconductor laser module.

The function of the diffraction grating 33 to prevent occurrence of a kink will be described in detail. Light generated by the active region 21 of the semiconductor light-emitting element 2 resonates between the light-reflecting surface 22 of the semiconductor light-emitting element 2 and the diffraction grating 33 of the optical fiber 3 to be output as a laser beam 41 having a desired wavelength determined by the characteristics of the diffraction grating 33. If part of light generated by the active region 21 is reflected by the light-exit surface 23, it resonates between the light-reflecting surface 22 and the light-exit surface 23 to be output as an unnecessary laser beam 42. As shown in FIG. 2, this unnecessary laser beam 42 forms many longitudinal modes and appears as a side lobe having many subpeaks 42a in the oscillation range of a wavelength spectra 41a of the desired laser beam 41. A wavelength interval $\Delta\lambda$ between the subpeaks 42a is given by the following equation (2):

$$\Delta\lambda = \lambda^2 / (2 \cdot n_2 \cdot L) \tag{2}$$

where $\lambda$: the wavelength 41a of the laser beam 41

$n_2$: effective refractive index; and

L: distance (resonator length) between the light-reflecting surface 22 and the light-exit surface 23 (resonator length)

Figure 3:
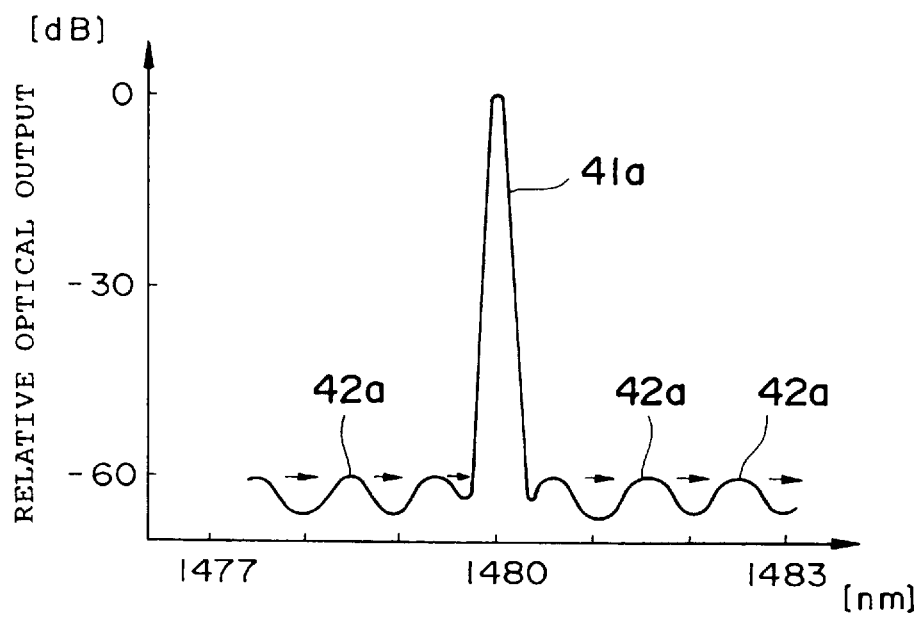
FIG. 3 is a graph showing the spectra of a laser beam output from a semiconductor laser module as the assumption of the present invention.

These subpeaks 42a tend to shift to the longer wavelength side (to the right in FIG. 2) as the temperature of the active region 21 increases in accordance with an increase in injection current. If the band width of the spectra 41a of the laser beam 41 is small as shown in FIG. 3, when the subpeaks 42a vary to overlap the wavelength of the spectra 41a, this variation largely influences the oscillation state of the desired laser beam 41. The influence of such unnecessary laser beam 42 is supposed to form a non-linear range (kink) in the characteristics of the optical output of the laser beam 41 with respect to the current, as shown in FIG. 10.

In order to avoid this kink, as shown in FIG. 2, the band width of the spectra 41a may be increased by increasing the reflection band width of the diffraction grating 33, so that even if the subpeaks 42a varies, this variation does not largely influence the spectra 41a. More specifically, when the band of the spectra 41a of the laser beam 41 is enlarged, the subpeaks 42a always exist in the band of the wavelength spectra 41a. Even if the wavelength of the subpeaks 42a may vary, this variation does not largely influence the spectra 41a, so that the oscillation state of the laser beam 41 becomes stable. Accordingly, the occurrence of a kink in the characteristics of the optical output of the laser beam 41 with respect to the injection current can be prevented.

Figure 12:
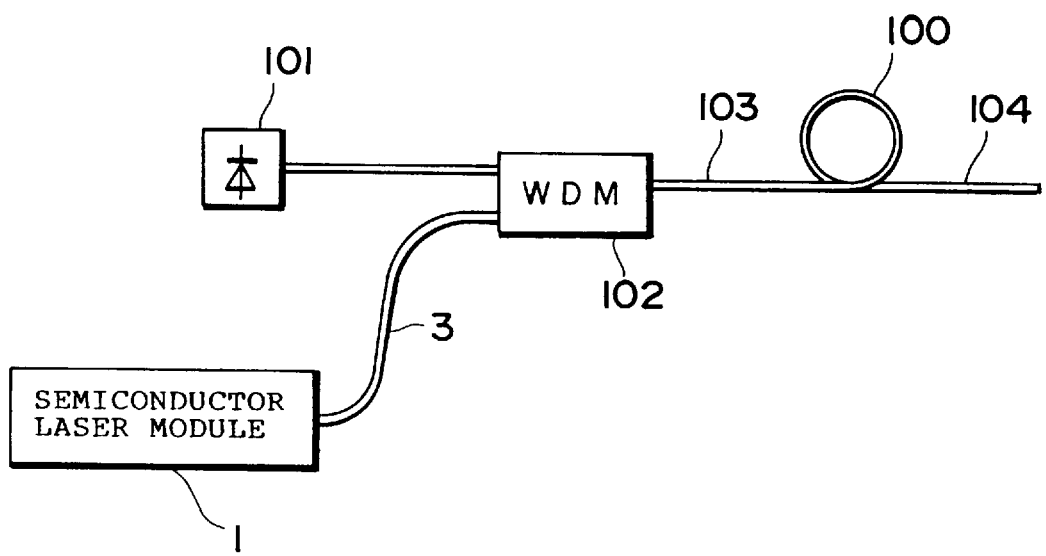
FIG. 12 shows an optical fiber amplifier using a semiconductor laser module.

If the semiconductor light-emitting element is a 1.48-$\mu$m band laser diode chip, the practical reflection wavelength band width of this diffraction grating 33 is preferably 2 nm or more. More specifically, in this case, the wavelength interval $\Delta\lambda$ of the subpeaks 42a becomes about 1.0 nm by substitution of $\lambda$=1.48 $\mu$m, $n_2$=3.5, and L=300 $\mu$m in equation (2) described above. Since the resonator length L of a laser diode chip used as an excitation light source for an Er (elbium) doped optical fiber amplifier (see FIG. 12) is 300 to 900 $\mu$m, the wavelength interval $\Delta\lambda$ of the subpeaks 42a becomes 0.3 to 1.0 nm by substitution of $\lambda$=1.48 $\mu$m, $n_2$=3.5, and L=300 to 900 $\mu$m in equation (2) described above. Hence, if the reflection wavelength band with of the diffraction grating 33 is 2 nm or more, a plurality of subpeaks 42a always exist in the band of the spectra 41a of the laser beam 41. Accordingly, even if the wavelength of these subpeaks 42a may vary due to an increase in injection current or the like, this variation does not largely influence the oscillation state of the laser beam 41, as described above, and the occurrence of a kink in the optical output characteristics can be avoided.

This diffraction grating 33 can be formed in accordance with interference exposure. More specifically, when ultraviolet light forming interference fringes in the axial direction may be irradiated on the germanium-doped core 32 from the outside of the optical fiber 3, the diffraction grating 33 having an effective refractive index in accordance with the light intensity distribution of the interference fringes is formed in the core 32. Although the diffraction grating 33 is formed at a predetermined distance away from the end portion of the optical fiber 3 in FIG. 1, it may be formed directly from the end portion of the optical fiber 3 with no distance from it.

The practical structure of the semiconductor laser module 1 described above will be described.

Figure 4:
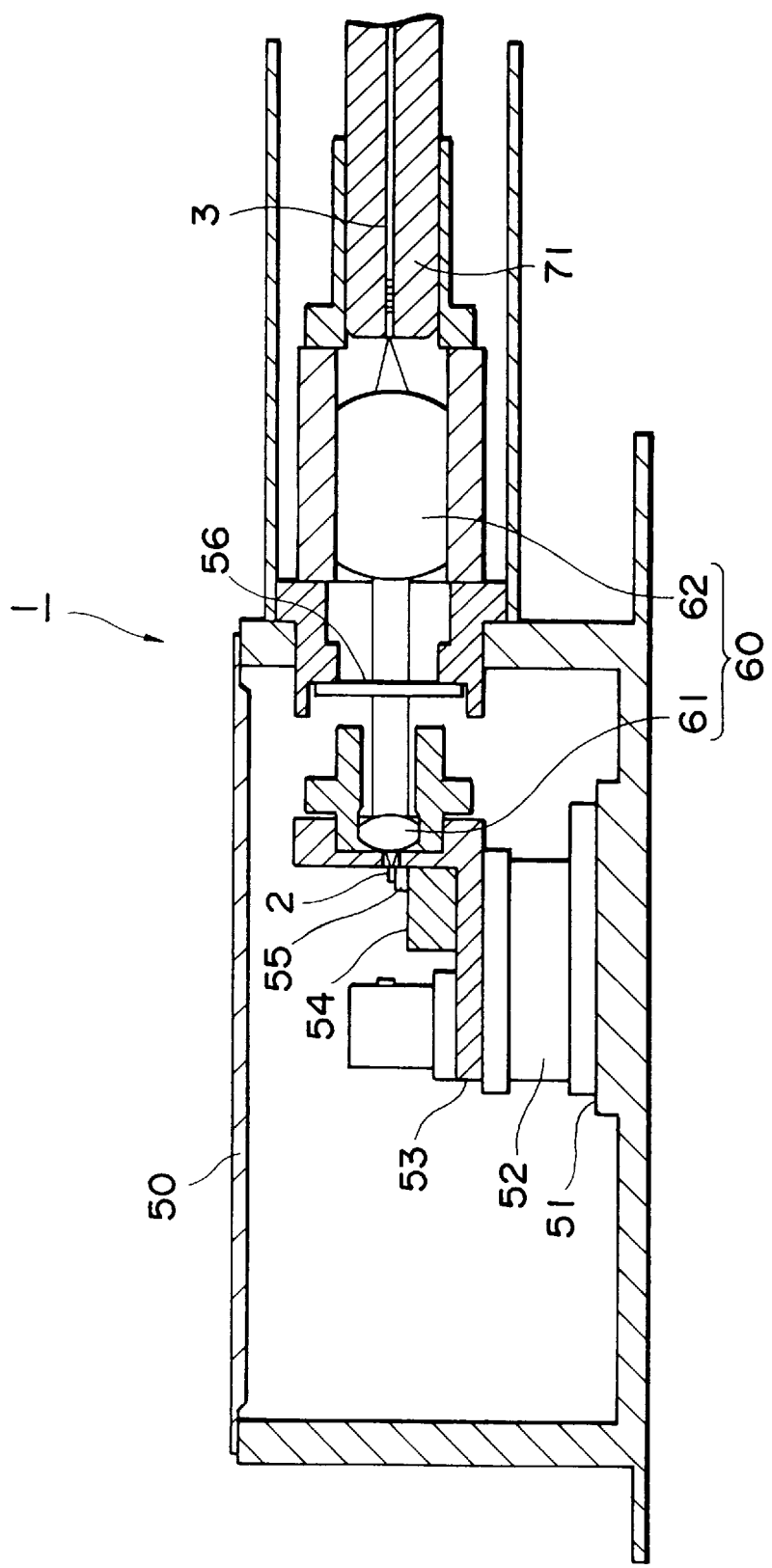
FIG. 4 is a view for explaining the structure of the semiconductor laser module.

Referring to FIG. 4, the semiconductor light-emitting element 2 is accommodated in a package 50, and is optically coupled to the optical fiber 3, mounted on the outside of the package 50, through a lens system 60. The package 50 is a box whose interior can be hermetically sealed. A Peltier element 52 is disposed on a floor surface 51 in the package 50. The Peltier element 52 generates heat upon application of a voltage and absorbs heat. An L-shaped carrier 53, a chip carrier 54, and a submount 55 are sequentially placed on the Peltier element 52, and the semiconductor light-emitting element 2 is mounted on the submount 55. The submount 55 serves as the heat sink of the semiconductor light-emitting element 2. The chip carrier 54 is a member formed by considering the mounting operability of the semiconductor light-emitting element 2. The L-shaped carrier 53 serves as a mount base for the semiconductor light-emitting element 2 and serves as the mount member for a first lens 61 of the lens system 60.

The semiconductor laser module 1 has the first lens 61 arranged to oppose the light-exit surface of the semiconductor light-emitting element 2. The heat sink 52 has an opening which is located between the light-exit surface of the semiconductor laser 2 and the first lens 61. Accordingly, the first lens 61 can be fixed to the semiconductor laser 2 by only fixing the first lens 61 to the heat sink 52.

The L-shaped carrier 53, the chip carrier 54, and the submount 55 are made of materials having a good thermal conductivity, and temperature control of the semiconductor light-emitting element 2 can be performed effectively by heating and cooling of the Peltier element 52. The first lens 61 performs coupling of light which reciprocally propagates between the semiconductor light-emitting element 2 and the optical fiber 3 on the semiconductor light-emitting element 2 side.

A hermetic glass member 56 is mounted in the side wall of the package 50. For example, a side wall portion of the package 50 opposing the first lens 61 described above is opened, and the hermetic glass member 56 is disposed in this opening. The hermetic glass member 56 is a translucent glass plate member. Light can propagate between the inside and outside of the package 50 through the hermetic glass member 56. A second lens 62 and a ferrule 71 are mounted on the outer side of the side wall of the package 50 formed with the hermetic glass member 56. The second lens 62 performs coupling of light which reciprocally propagates between the semiconductor light-emitting element 2 and the optical fiber 3 on the optical fiber 3 side. The second lens 62 is arranged to oppose the first lens 61 through the hermetic glass member 56. The ferrule 71 is a member for holding the optical fiber 3. The optical fiber 3 can be mounted in a small-diameter through hole formed at the center of the ferrule 71. In the semiconductor laser module 1 having this structure, the semiconductor light-emitting element 2 disposed in the package 50 and the optical fiber 3 disposed outside the package 50 are optically coupled to each other through the first lens 61, the hermetic glass member 56, and the second lens 62. Thus, light can be amplified between the semiconductor light-emitting element 2 and the optical fiber 3 and be output through the optical fiber 3.

The operation of the semiconductor laser module 1 will be described.

Referring to FIG. 1, a predetermined voltage is applied across the cladding layers 24 of the semiconductor light-emitting element 2 to inject a current to the cladding layers 24 and the active region 21. The cladding layers 24 and the active region 21 are excited to generate spontaneous emission light. The spontaneous emission light causes induced emission in the active region 21, propagates together with induced emission light, is reflected by the light-reflecting surface 22 having a high reflectance, and emerges from the light-exit surface 23 having a low reflectance. However, part of the light is reflected by the light-exit surface 23 and sometimes resonates between the light-exit surface 23 and the light-reflecting surface 22.

Light emerging from the light-exit surface 23 toward the optical fiber 3 is incident into the core 32 of the optical fiber 3, propagates along the core 32, and is reflected by the diffraction grating 33. At this time, only light reflected by the diffraction grating 33 and having a predetermined wavelength band propagates toward the semiconductor light-emitting element 2, emerges from the end face of the optical fiber 3, and is incident into the active region 21 through the light-exit surface 23 of the semiconductor light-emitting element 2. Light propagating in the active region 21 is reflected by the light-reflecting surface 22 while being amplified again, repeats reciprocal propagation to be amplified between the light-reflecting surface 22 and the diffraction grating 33 of the optical fiber 3, and is transmitted through the diffraction grating 33 and output as the desired laser beam 41. Together with the laser beam 41, light resonating between the light-reflecting surface 22 and the light-exit surface 23 in the semiconductor light-emitting element 2 is also amplified and output as the unnecessary laser beam 42. Since the reflection wavelength band width of the diffraction grating 33 is set to be larger than the wavelength interval of the longitudinal mode of the laser beam 42, the wavelength spectra 41a of the laser beam 41 have a band wider than the wavelength interval of this longitudinal mode.

When the injection current to the semiconductor light-emitting element 2 is increased, in the unnecessary laser beam 42, the subpeaks 42a of the longitudinal mode start to shift to the longer wavelength side due to an increase in temperature of the active region 21 or the like, as shown in FIG. 2. In contrast to this, in the desired laser beam 41, since its wavelength is determined by the diffraction grating 33 of the optical fiber 3, the wavelength of the wavelength spectra 41a is not influenced by an increase/decrease in injection current but is stable. Therefore, the subpeaks 42a of the laser beam 42 pass through the spectra 41a of the laser beam 41.

However, since the wavelength spectra 41a of the laser beam 41 have a wide band width, even if the subpeaks 42a vary due to an increase in injection current or the like, the laser beam 41 is not largely influenced by this variation. When the antireflection coating is formed on the light-exit surface 23 of the semiconductor light-emitting element 2 to decrease the reflectance, light resonance between the light-reflecting surface 22 and the light-exit surface 23 can be decreased. As a result, the output level of the unnecessary laser beam 42 is decreased. Even if the wavelength of the subpeaks 42a of the laser beam 42 varies, this variation does not largely influence the laser beam 41. Hence, the oscillation state of the desired laser beam 41 becomes stable, and a non-linear range (kink) does not occur in the output characteristics of oscillation of the laser beam 41 with respect to the injection current.

Figure 5:
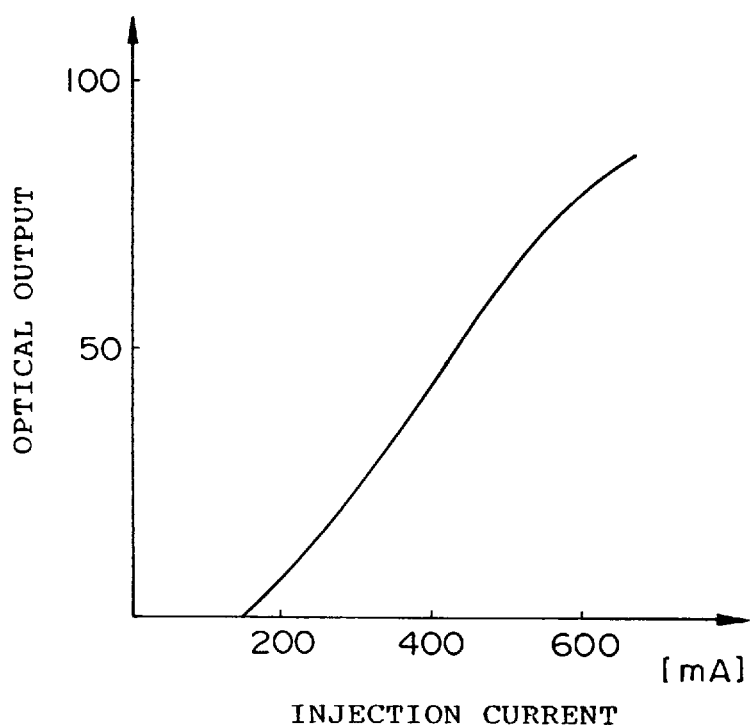
FIG. 5 is a graph showing the optical output characteristics of the laser beam in the semiconductor laser module with respect to the injection current.

FIG. 5 shows the output characteristics with respect to the injection current which were obtained when the semiconductor laser module 1 was operated in practice. Referring to FIG. 5, even if the injection current was gradually increased, a non-linear range (kink) did not occur in the optical output, and stable optical output characteristics were obtained. At this time, the semiconductor laser module 1 used a 1.48-μm band semiconductor light-emitting element 2. The diffraction grating 33 had a reflection wavelength band width of 2 nm. An antireflection coating having a reflectance of 0.1% was formed on the light-exit surface 23.

Figure 11:
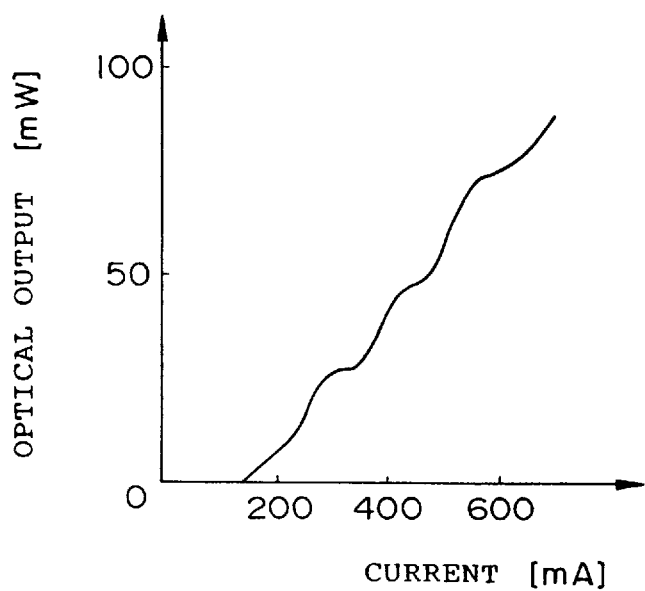
FIG. 11 is a graph showing the output characteristics of the laser beam of the semiconductor laser module to be compared with the present invention.

The output characteristics with respect to the injection current which are obtained when the semiconductor laser module to be compared with the present invention was operated are shown in FIG. 10, as described above. This semiconductor laser module used a 1.48-μm band semiconductor light-emitting element. The diffraction grating 33 had a reflection wavelength band width of 0.5 nm. An antireflection coating having a reflectance of 1.7% was formed on the light-exit surface 23. In this semiconductor laser module, when the reflection wavelength band width of the diffraction grating 33 was increased to 2 nm, the output characteristics with respect to the injection current as shown in FIG. 11 were obtained, as shown in FIG. 11. More specifically, since the reflectance of the light-exit surface 23 was still as high as 1.7%, a composite resonator was formed between the semiconductor light-emitting element 2 and the diffraction grating 33. The effect of widening the reflection wavelength band width was impaired, and a moderately winding kink occurs in the optical output characteristics with respect to the injection current.

(Second Embodiment)

Figure 6:
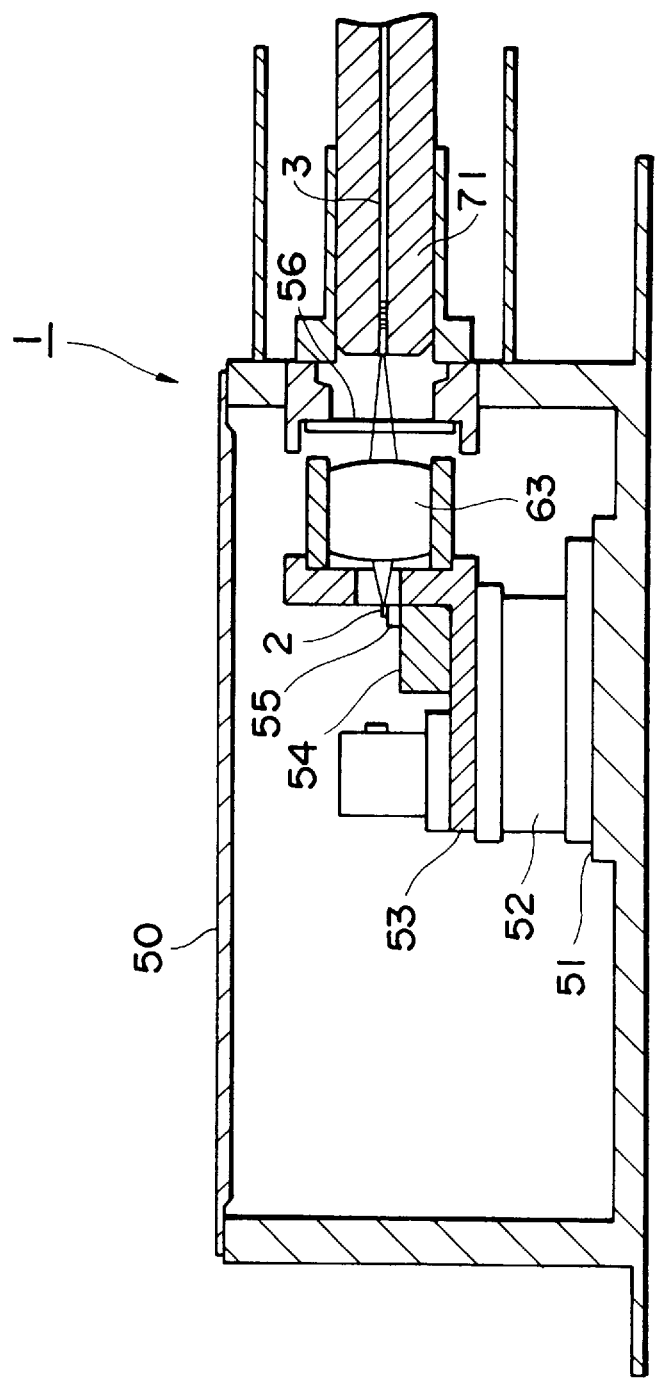
FIG. 6 is a view for explaining the structure of a semiconductor laser module.

In the semiconductor laser module 1 described above, the first lens 61 and the second lens 62 of the lens system 60 may be constituted by one lens as a practical mounting structure. For example, as shown in FIG. 6, if a condenser lens 63 is mounted on an L-shaped carrier 53 so as to be arranged at the exit position of light generated by a semiconductor light-emitting element 2, the semiconductor light-emitting element 2 and an optical fiber 3 can be optically coupled to each other.

(Third Embodiment)

In the semiconductor laser module 1 described above, the lens system 60 for optically coupling the semiconductor light-emitting element 2 and the optical fiber 3, and the condenser lens 63 need not be disposed as the practical mounting structure, but an optical fiber 3 may be inserted in a package 50 to extend through its side wall without forming a hermetic glass member 56, so that the optical fiber 3 is directly optically coupled to the semiconductor light-emitting element 2.

(Fourth Embodiment)

In the semiconductor laser module 1 described above, the reflection wavelength band width of the diffraction grating 33 is sometimes set to 2 nm to 5 nm. More specifically, the reflection wavelength band width of the diffraction grating 33 is set to 2 nm or more, as in the first embodiment. If the reflection wavelength band width is limited to 5 nm or less, the semiconductor laser module 1 can be effectively utilized as an excitation light source for an optical amplifier. For example, if the reflection wavelength band width of the semiconductor laser module 1 is set to 2 nm or more, the optical output can be stably controlled, and the semiconductor laser module 1 accordingly satisfies a necessary condition as an excitation light source. Also, if the reflection wavelength band width is set to 5 nm or less, the spectrum band width of the oscillated laser beam becomes about 8 nm, providing a narrow spectrum range suitable for excitation of an erbium-doped fiber. Thus, the semiconductor laser module 1 becomes useful as an excitation light source for an optical amplifier.

(Fifth Embodiment)

Figure 7:
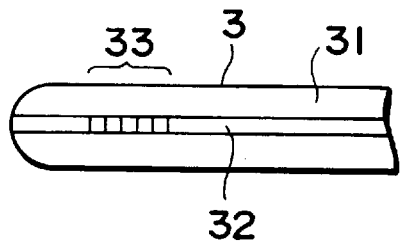
FIG. 7 is a view for explaining a semiconductor laser module according to the fifth embodiment.

In the semiconductor laser module 1 described above, the distal end of the optical fiber 3 may be formed spherical. For example, as shown in FIG. 7, if the distal end of an optical fiber 3 on a semiconductor light-emitting element 2 side is formed spherical, the optical coupling efficiency between the optical fiber 3 and the semiconductor light-emitting element 2 can be improved.

(Sixth Embodiment)

Figure 8:
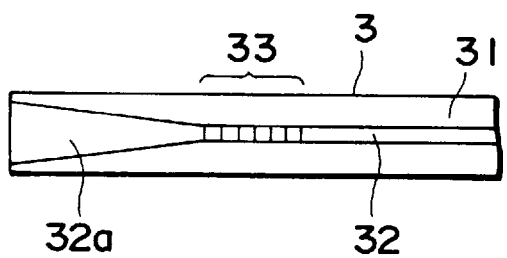
FIG. 8 is a view for explaining a semiconductor laser module according to the sixth embodiment.

In the semiconductor laser module 1 described above, the diameter of the core 32 of the optical fiber 3 may be increased toward the end portion. For example, as shown in FIG. 8, at the end portion of an optical fiber 3 on a semiconductor light-emitting element 2 side, when a large-diameter portion 32a is formed in a core 32, even if a positional error occurs in the optical fiber 3, a decrease in coupling efficiency between the optical fiber 3 and the semiconductor light-emitting element 2 can be prevented.

Finally, an optical fiber amplifier using the semiconductor laser module 1 described above will be described with reference to FIG. 12. This optical fiber amplifier has a semiconductor laser module 1 identical to that described above, an erbium-doped fiber 100, and a light source 101 for generating a signal beam. This optical fiber amplifier also has a wavelength multiplexer/demultiplexer (WDM) 102 to which excitation light emitted from a semiconductor laser 2 of the semiconductor laser module 1 is input through an optical fiber 3. The wavelength multiplexer/demultiplexer 102 also receives the signal beam emitted from the light source 101. These excitation beam and signal beam are multiplexed. The multiplexed beam is guided to the erbium-doped fiber 100 through an optical fiber 103 not having an amplification function. The amplified beam is output through an optical fiber 104 not having an amplification function. More specifically, the wavelength multiplexer/demultiplexer 102 optically couples the signal beam and the excitation beam to the erbium-doped fiber 100. The semiconductor laser module 1 outputs a 1.48-μm band laser beam. The signal beam is amplified in the erbium-doped fiber 100. A change in output of the excitation beam output from the semiconductor laser module 1 is small, as described above. Therefore, the gain of the signal beam can be maintained at a substantially constant value.

As has been described above, according to the module of the present invention, the following effects can be obtained. Since the reflection wavelength band width of the diffraction grating is set to be larger than the wavelength interval of the longitudinal mode of light resonating between the light-reflecting surface and the light-exit surface of the semiconductor light-emitting element, occurrence of a non-linearity (kink) in the optical output characteristics of the oscillation of the laser beam with respect to the injection current can be prevented, and the output of the laser beam can be controlled stably.

The semiconductor light-emitting element is a 1.48-μm band laser diode chip, and the diffraction grating has a reflection band width of 2 nm or more. Therefore, occurrence of a non-linear range (kink) in the optical output characteristics of the oscillation of the laser beam of this semiconductor light-emitting element with respect to the injection current can be reliably prevented.

When the diffraction grating has a reflection band width of 2 nm to 5 nm, occurrence of a kink can be prevented in the optical output characteristics with respect to the injection current, and the spectrum band of the laser beam can be narrow. As a result, this semiconductor laser module becomes useful as an excitation light source in optical amplification using an erbium-doped fiber.

When an antireflection coating having a reflectance of 1% or less is formed on the light-exit surface of the semiconductor light-emitting element, light resonance between the light-reflecting surface and the light-exit surface of the semiconductor light-emitting element is suppressed. As a result, occurrence of a non-linear range (kink) in the optical output characteristics of the laser beam with respect to the injection current can be prevented effectively.

When the distal end of the optical fiber is formed spherical, the coupling efficiency between the optical fiber and the semiconductor light-emitting element can be improved. As a result, the maximum output characteristics of the laser beam are improved.

When the diameter of the core of the optical fiber is increased toward the end portion, a decrease in coupling efficiency between the optical fiber and the semiconductor light-emitting element caused by the positional error of the optical fiber can be prevented.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 085289/1996 filed on Apr. 8, 1996 is hereby incorporated by reference.

What is claimed is:

1. A semiconductor laser module comprising:
   (a) a semiconductor laser having an active region between a light-reflecting surface and a light-exit surface thereof; and
   (b) an optical fiber optically coupled to said semiconductor laser and including an optical fiber diffraction grating, said optical fiber diffraction grating serving to selectively reflect light within a predetermined wavelength band,
   wherein the wavelength band has a width larger than a wavelength interval of a longitudinal mode of light resonating between said light-reflecting surface and said light-exit surface.

2. A module according to claim 1, further comprising:
   a package having said semiconductor laser arranged therein; and
   a Peltier element thermally connected to said semiconductor laser and arranged in said package.

3. A module according to claim 2, further comprising a heat sink arranged between said Peltier element and said semiconductor laser and fixed to said Peltier element and said semiconductor laser.

4. A module according to claim 3, comprising a first lens arranged to oppose said light-exit surface of said semiconductor laser, and wherein said heat sink has an opening located between said light-exit surface of said semiconductor laser and said first lens.

5. A module according to claim 1, further comprising an antireflection coating having a reflectance of not more than 1% and formed on said light-exit surface of said semiconductor laser.

6. A module according to claim 5, wherein said antireflection coating comprises a dielectric multilayer film.

7. A module according to claim 6, wherein said dielectric multilayer film contains at least two materials selected from the group consisting of $SiO_2$, $TiO_2$, SiN, $Al_2O_3$, $MgF_2$, and amorphous silicon.

8. A module according to claim 1, wherein said semiconductor laser comprises a semiconductor laser for emitting light within a 1.48-$\mu$m band, and a width of said predetermined wavelength band of the light reflected by said optical fiber diffraction grating is 2 nm to 5 nm.

9. A module according to claim 1, wherein an end portion of said optical fiber on said semiconductor laser side is substantially spherical.

10. A module according to claim 1, wherein said optical fiber has a core with a diameter that increases toward said semiconductor laser.

11. A semiconductor laser module, comprising:
    a semiconductor laser having an active region between a light-reflecting surface and a light-exit surface thereof;
    an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface
    a package having said semiconductor laser arranged therein;
    a Peltier element thermally connected to said semiconductor laser and arranged in said package;
    a first lens arranged in said package to oppose said light-exit surface of said semiconductor laser; and
    a second lens arranged outside said package to oppose said first lens,
    wherein positions of said light-exit surface, said first lens, said second lens, and said optical fiber diffraction grating are fixed.

12. A module according to claim 11, further comprising a hermetic glass member formed in said package, said hermetic glass member being interposed between said semiconductor laser and said optical fiber diffraction grating.

13. An optical fiber amplifier comprising:
    a semiconductor laser module comprising:
        (a) a semiconductor laser having an active region between a light-reflecting surface and a light-exit surface thereof; and
        (b) an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface
    an ebrium-doped fiber; and
    a wavelength multiplexer/demultiplexer for optically coupling said semiconductor laser and said erbium-doped fiber to each other through said optical fiber.

14. An optical fiber amplifier comprising:
    a semiconductor laser module comprising:
        (a) a semiconductor laser having an active region between a light-reflecting surface and a light-exit surface thereof for emitting light within a 1.48-$\mu$m band; and
        (b) an optical fiber optically coupled to said semiconductor laser and including an optical fiber diffraction grating, said optical fiber diffraction grating serving to selectively reflect light within a predetermined wavelength band of 2 nm to 5 nm, wherein the wavelength band has a width larger than a wavelength interval of a longitudinal mode of light resonating between said light-reflecting surface and said light-exit surface;
    an erbium-doped fiber; and
    a wavelength multiplexer/demultiplexer for optically coupling said semiconductor laser and said erbium-doped fiber to each other through said optical fiber.

* * * * *

(12) EX PARTE REEXAMINATION CERTIFICATE (4960th)
United States Patent
Sasaki et al.

(10) Number: US 5,845,030 C1
(45) Certificate Issued: Jul. 13, 2004

(54) SEMICONDUCTOR LASER MODULE AND OPTICAL FIBER AMPLIFIER

(75) Inventors: Goro Sasaki, Yokohama (JP); Atsushi Hamakawa, Yokohama (JP)

(73) Assignee: Sumitomo Electric Industries, Ltd., Osaka (JP)

Reexamination Request:
No. 90/006,234, Mar. 4, 2002

Reexamination Certificate for:
Patent No.: 5,845,030
Issued: Dec. 1, 1998
Appl. No.: 08/831,254
Filed: Apr. 8, 1997

(30) Foreign Application Priority Data

Apr. 8, 1996 (JP) ............................................. 8-085289

(51) Int. Cl.⁷ ............................................. G02B 6/36
(52) U.S. Cl. ............................ 385/88; 385/37; 385/93; 372/102
(58) Field of Search ........................ 385/88, 89, 90, 385/91, 92, 93, 94, 12, 37, 123; 372/6, 18, 20, 43, 49, 92, 96, 102, 107, 108; 250/227.11, 227.13, 227.23, 227.24

(56) References Cited

U.S. PATENT DOCUMENTS

| | | | |
|---|---|---|---|
| 4,468,773 A | 8/1984 | Seaton | 372/32 |
| 4,639,922 A | 1/1987 | Miller | 372/19 |
| 4,786,132 A | 11/1988 | Gordon | 385/37 X |
| 4,787,086 A | 11/1988 | Dentai et al. | 372/19 |
| 4,803,689 A | 2/1989 | Shibanuma | 372/36 |
| 4,817,100 A | 3/1989 | Cameron et al. | 372/22 |
| 4,963,832 A | 10/1990 | Desurvire et al. | 330/4.3 |
| 4,993,032 A | 2/1991 | Bradley | 372/20 |
| 5,091,916 A | 2/1992 | Cimini, Jr. et al. | 372/96 |
| 5,184,247 A | 2/1993 | Schimpe | 359/344 |
| 5,185,752 A | 2/1993 | Welch et al. | 372/22 |
| 5,218,655 A | 6/1993 | Mizrahi | 385/39 |
| 5,237,576 A | 8/1993 | DiGiovanni et al. | 372/6 |
| 5,251,229 A | 10/1993 | Bennett, Jr. et al. | 372/92 |
| 5,278,929 A | 1/1994 | Tanisawa et al. | 385/93 |
| 5,305,336 A | 4/1994 | Adar et al. | 359/18 |
| 5,309,260 A | 5/1994 | Mizrahi et al. | 359/3 |
| 5,321,718 A | 6/1994 | Waarts et al. | 372/108 |
| 5,343,542 A | 8/1994 | Kash et al. | 385/31 |
| 5,397,891 A | 3/1995 | Udd et al. | 250/227.18 |
| 5,434,876 A | 7/1995 | Atkins et al. | 372/31 |
| 5,446,816 A | 8/1995 | Shiraishi et al. | 385/33 |
| 5,450,427 A | 9/1995 | Fermann et al. | 372/18 |
| 5,475,780 A | 12/1995 | Mizrahi | 385/37 |
| 5,485,481 A * | 1/1996 | Ventrudo et al. | 372/6 |
| 5,563,732 A | 10/1996 | Erdogan et al. | 359/341 |
| 5,570,440 A | 10/1996 | Mizrahi | 383/37 |
| 5,589,684 A | 12/1996 | Ventrudo et al. | 250/225 |
| 5,589,990 A | 12/1996 | Kato et al. | 359/799 |
| 5,659,559 A * | 8/1997 | Ventrudo et al. | 385/10 X |
| 5,699,377 A * | 12/1997 | Pan | 385/37 X |
| 5,710,786 A | 1/1998 | Mackechnie et al. | 372/6 |
| 5,715,263 A | 2/1998 | Ventrudo et al. | 372/6 |
| 5,724,377 A | 3/1998 | Huang | 372/98 |

FOREIGN PATENT DOCUMENTS

| | | | |
|---|---|---|---|
| JP | 57-028391 | 2/1982 | 372/43 X |
| JP | 61-295518 | 12/1986 | 372/43 X |
| JP | 3-049281 | 3/1991 | 372/43 X |

(List continued on next page.)

OTHER PUBLICATIONS

D. Hargreaves et al., OFC '96 Technical Digest, "*Highpower 980–nm pump module operating without a thermoelectric cooler*," pp. 229–230.

(List continued on next page.)

*Primary Examiner*—Brian Healy

(57) ABSTRACT

A semiconductor laser module includes a semiconductor laser having an active region between a light-reflecting surface and a light-exit surface thereof, and an optical fiber optically coupled to the semiconductor laser and including an optical fiber diffraction grating. The optical fiber diffraction grating selectively reflects light within a predetermined wavelength band. The wavelength band has a width larger than a wavelength interval of a longitudinal mode of light resonating between the light-reflecting surface and the light-exit surface.

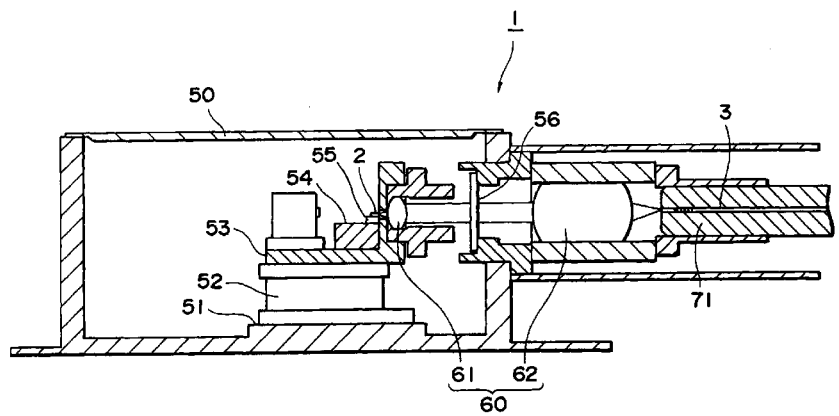

FOREIGN PATENT DOCUMENTS

| | | | | |
|---|---|---|---|---|
| JP | 4-262586 | 9/1992 | | 372/43 X |
| JP | 4-343492 | 11/1992 | | 372/43 X |
| JP | 5-119242 | 5/1993 | | 372/43 X |
| JP | 5-136511 | 6/1993 | | 372/6 X |
| JP | 5-206580 | 8/1993 | | 372/43 X |
| JP | 5-206579 | 9/1993 | | 372/43 X |
| JP | 6-120617 | 4/1994 | | 372/43 X |
| JP | 6-186501 | 7/1994 | | 372/43 X |
| JP | 6-291423 | 10/1994 | | 372/43 X |
| JP | 6-318762 | 11/1994 | | 372/43 X |
| JP | 7-092335 | 4/1995 | | 372/43 X |
| JP | 7-209556 | 8/1995 | | 372/43 X |
| JP | 7-294779 | 11/1995 | | 385/33 X |
| JP | 7-333470 | 12/1995 | | 385/92 X |
| JP | 7-333474 | 12/1995 | | 385/33 X |
| JP | 8-201609 | 8/1996 | | 385/37 X |
| JP | 9-246645 | 9/1997 | | 385/43 X |
| JP | 10-200178 | 7/1998 | | 385/42 X |
| WO | WO 96/00997 | 1/1996 | | 372/43 X |

OTHER PUBLICATIONS

R.J. Campbell et al., ECOC '95, "*A Wavelength Stable Uncooled Laser for Access Networks,*" pp. 545–548.

C.R. Giles et al., Optical Amp. And Their Applications, "*Simultaneous Wavelength–stabilization of 980–nm Pump Lasers,*" pp. 380–383; IEEE Jul. 4–6, 1993, Yokahama Japan.

I. Mito et al., Optical Amp. And Their Applications, "*1.48 µm and 0.98 µm High–Power Laser Diodes for Erbium–Doped Fiber Amplifiers,*" (1993) pp. 22–25.

G. Agrawal, J. Appl. Phys. 59(12), "*Longitudinal–mode stabilization in semiconductor lasers with wavelength–selective feedback,*" pp. 3958–3961.

P.A. Morton et al., IEEE Photonics Technology Letters 7(1), "*Packaged Hybrid Soliton Pulse Source Results and 270 Terabit.km/sec Soliton Transmission,*" (1995) pp. 111–113.

J. Yu et al., Electronics Letters 31(23), "*Fourier–transform–limited 2.5 ps light pulses with electrically tunable wavelength (15 nm) by hybridly modelocking a semiconductor laser in a chirped Bragg grating fibre external cavity,*" (1995) pp. 2008–2009.

E. Brinkmeyer et al., Electronics Letters 22(3), "*Fibre Bragg Reflector For Mode Selection And Line–Narrowing Of Injection Lasers,*" (Jan. 30, 1986) pp. 134–135.

C.A. Park et al., Electronics Letters 22(21), "*Single–Mode Behaviour of a Multimode 1.55 µm Laser with a Fibre Grating External Cavity,*" (Oct. 9, 1986) pp. 1132–1133.

R.J. Campbell et al., Electronics Letters 32(2), "*Wavelength stable uncooled fibre grating semiconductor laser for use in an all optical WDM access network,*" (Jan. 18, 1996) pp. 119–120.

D.M. Bird et al., Electronics Letters 27(13), *Narrow Line Semiconductor Laser Using Fibre Grating,* (Jun. 1991) pp. 1115–1116.

H. Asano et al., IEEE Phototonics Technology Letters 3(5), "*1.47–µm High–Power InGaAs/InGaAsP MQW LD's for Er–Doped Fiber Amplifiers,*" (May 1991) pp. 415–417.

B.F. Ventrudo et al., Electronics Letters 30(25), "*Wavelength and intensity stabilisation of 980 nm diode lasers coupled to fibre Bragg gratings,*" (Dec. 8, 1994) pp. 2147–2149.

Handbook of applied opto–electronics, §2 *Light emitting, receiving devices,* (Apr. 10, 1989).

Nakagawa et al., "*Optical Amplifier and its Application*", §5 *Erbium Doped Fiber Amplifier* (May 30, 1992).

T. Wakami et al., IEICE Autumn meeting C156, "*0.98 µm laser diodes with fiber Bragg gratings*" (1995), p. 156; with translation.

M. Shigehara et al.,IEICE Spring meeting, "*Single Longitudinal Mode Laser Diode using Fiber Bragg Grating,*" (1995), p. 380; with translation.

Y. Emori et al., IEICE Tech. Report, "*A broadband dispersion compensating Raman amplifier pumped by multi–channel WDM laser diodes,*" (1998), pp. 7–12.

A. Hamakawa et al., 22nd European Conference on Optical Communication—ECOC '96 Oslo, *Wavelength Stabilization of 1.48 µm Pump Laser by Fiber Grating,* (1996) pp. 1.119–1.122.

Erbium Doped Fiber Amplifier, Chapter 3.8, "*Fiber Gratings*" (1999).

A. Kasukawa, OFC IOOC '99, "*Recent Progress of High Power Laser Diodes for EDFA Pumping,*" pp. 20–21 (Feb. 23, 1999).

D.L. Williams et al., Proc.—ECOC '93, "*Temperature Stable 1.3 µm Laser with Bragg Fibre Grating External Cavity for Access Networks*", Tu 11, 209–212 (1993).

P.A. Morton et al., Applied Physics Letters, "*Stable Single Mode Hybrid Laser with High Power and Narrow Linewidth*", 64(20), 2634–2636 (May 1994).

S.Y. Huang et al., CLEO '95, "*Optical–Feedback Included Degradations of the Spectrum and the Kink Current of 980–nm Pump Lasers*", pp. 76–77 (1995).

C.R. Giles et al., IEEE Photonics Technology Letters, "*Reflection–Induced Changes in the Optical Spectra of 980–nm QW Lasers*", vol. 6, No. 8, pp. 903–906 (Aug. 1994).

Manijeh Razeghi, Proceedings—SPIE, "*Physical Concepts of Materials for Novel Optoelectronic Device Applications II: Device Physics and Applications*", vol. 1362, p. 350–360 (1990).

Jens Buus, SPIE Optical Engineering Press, Single Frequency Semiconductor Lasers, vol. TT5, *Chapter 8: "Narrow Linewidth Lasers"*, p. 81–90.

R.J. Horley et al., Poster Preview: System Technologies, "*System Measurements Using a Miniature Packaged Narrow Linewidth Fiber Grating Laser*".

Graeme D. Maxwell et al., OFC '94 Technical Digest, "*Semiconductor External–Cavity Laser with a UV–Written Grating in a Planar Silica Waveguide*", pp. 151–152 (1994).

K.Y. Liou et al., Electronic Letters 21(20), "*Narrow–Linewidth Fibre–External–Cavity Injection Lasers*", pp. 933–934 (Sep. 1985).

R.W. Tkach, J. Lightwave Technology, "*Regimes of Feedback Effects in 1.5–µm Distributed Feedback Lasers*", vol. LT.–4, No. 11, pp. 1655–1661 (Nov. 1986).

P.A. Morton et al., OFC '94 Technical Digest, "*High–Power, Narrow–Linewidth, Stable Single–Mode Hybrid Laser*", pp. 102–103 (1994).

G. Meltz et al., "*Formation of Bragg Gratings in Optical Fibers by a Transverse Holographic Method*", 3 pages (1989).

K.O. Hill et al., Appl. Phys. Lett. 62(10), "*Bragg Gratings Fabricated in Monomode Photosensitive Optical Fiber by UV Exposure through a Phase Mask*", pp. 1035–1037 (Mar. 1993).

T. Kato et al., IEICE Trans. Electron., "*Fiber–Grating Semiconductor Laser Modules for Dense–WDM Systems*", vol. E82–C, No. 2, pp. 357–359 (Feb. 1999).

T. Takagi et al., ECOC '98, "*Fiber–Grating External–Cavity Laser Diode Module for 2.5 Gb/s Dense WDM Transmission*", 2 pages (1998).

A. Hamakawa et al., IEICE '97, "*Multi–Wavelength Fiber-Grating External–Cavity Laser Array*", 1 page (1997) (no translation).

A. Hamakawa et al., OECC '96, "*Characteristics of Modulation Distortion of Fiber–Grating External–Cavity–Laser*", 2 pages (1996).

A. Hamakawa et al., OECC '97, "*1480 nm Pump Fiber-Grating External–Cavity–Laser with Two Fiber Gratings*", 2 pages (1997).

A. Hamakawa et al., "*Fiber–Grating External–Cavity Laser*", 4 pages (no translation).

A. Hamakawa et al., OFC '97 Technical Digest, "*A 4–Channel Multi–Wavelength Fiber–Grating External–Cavity Laser Array*", 7 pages (1997).

A. Hamakawa et al., CLEO '96, "*Fiber–Grating External-Cavity Laser with MQW Semiconductor Optical Amplifier for Wide Temperature Range Operation*", 7 pages (1996).

A. Hamakawa et al., OECC '96, "*Study of Modulation Distortion of Fiber–Grating External–Cavity–Laser*", 2 pages (1996) (no translation).

A. Kasukawa et al., OFC Technical Digest, "*Recent Developments in High–Power Semiconductor Lasers for Pumping of Optical Fiber Amplifers*", pp. 19–23 (no translation).

A. Mugino et al., "Output Power Optimization of 980 $\mu$m Pump Lasers Wavelength–Locked Using Fiber Bragg Grating", pp. 24–29 (no translation).

Y. Emori et al., IEICE, "*Demonstration of Broadband Raman Amplifier as a Promising Application of High–Power Pumping Unit*", pp. 42–45 (1999) (no translation).

N. Hashizume et al., "*Mode Hopping Control and Lasing Wavelength Stabilization of Fiber Grating Lasers*", pp. 7–10 (no translation).

Y. Tashiro et al., "*Development of High Power Optical Amplifier*", pp. 59–62 (no translation).

I. Ota et al., "*Development of Optical Fiber Gratings for WDM Systems*", pp. 63–68 (no translation).

T. Kimura et al., Optical Amplifiers and Their Applications Conference, 1999 Technical Digest, TuD12, "*High Temperature Operation Quarter Watt 1480 nm Pump LD Module*", pp. 224–226 (1999).

A. Mugino et al., OFC '99 Technical Digest, TuC4–1, "*Realization of High Power and Wavelength Stabilized 980 nm–Pump Laser Diode Module with Fiber–Bragg–Grating by Optimizing the Effective Reflectiveity with Spatial–Hole-Burning Effect*", pp. 29–31 (1999).

K. Tanaka et al., OFC '99, TuH5–1, "*Low Loss Integrated Mach–Zehnder–Interferometer–Type Eight–Wavelength Multiplexer for 1480 nm Bank Pumping*", pp. 88–90 (1999).

A. Mugino el al., IEICE, "*1480 nm Pumping Laser with Fiber Bragg Grating*", pp. 37–42 (1998) (no translation).

S. Koyanagi et al., Optical Amplifiers and Their Applications, "*The Ultra High–Poser 1480 nm Pump Laser Diode Module with Fiber Bragg Grating*", pp. 151–154 (1998).

Y. Tashiro et al., Optical Amplifiers and Their Applications, "*1.5 W Erbium Doped Fiber Amplifier Pumped by the Wavelength Division–Multiplexed 1480 nm Laser Diodes with Fiber Bragg Grating*", pp. 18–20 (1998).

Y. Tashiro et al., OFC'97 Technical Digest, WA5, "*High-Power Erbium–Doped Fiber Amplifier Pumped by Wavelength Multiplexed Semiconductor Laser Diode Unit*", pp. 107–108 (1997).

M. Seki et al., OFC '95 Technical Digest, WS3, "*High-Power, High–$T_{cr}$ High–Reliability Pump–Laser Modules*", pp. 213–214 (1995).

H. Masuda et al., Electronic Letters 28(20), "*Pump–Wavelength–Locked Erbium–Doped Fibre Amplifier Employing Novel External Cavity for 0.98 $\mu$m Laser Diode*", pp. 1855–1857 (Sep. 1992).

R. Kashyap et al., Electronic Letters 29(2), "Wideband Gain Flattened Erbium Fibre Amplilfier Using a Photosensitive Fibre Blazed Grating", pp. 154–156 (Jan. 1993).

R. Kashyap et al., Electronics Letters 30(13), "*30 ps Chromatic Dispersion Compensation of 400 fs Pulses at 100 Gbits/s in Optical Fibres Using an All Fibre Photoinduced Chirped Reflection Grating*", pp. 1078–1080 (Jun. 1994).

P.A. Morton et al., IEEE Photonics Technology Letters 5(1), "*Mode–Locked Hybrid Soliton Pulse Source with Extremely Wide Operating Frequency Range,*" pp. 28–31, (Jan. 1993).

V. Mizrahi et al., J. Lightwave Technology 11(10), "*Optical Properties of Photosensitive Fiber Phase Gratings*", pp. 1513–1516 (Oct. 1993).

P.J. LeMaire et al., Electronics Letters 29(13), "*High Pressure $H_2$ Loading as a Technique for Achieving Ultrahigh U.S. Photosensitivity and Thermal Sensitivity in $GeO_2$ Doped Optical Fibres*", pp. 1191–1192 (Jun. 1993).

P.A. Morton et al., Electronics Letters 28(6), "*Hybrid Solition Pulse Source with Fibre External Cavity and Bragg Reflector*", pp. 561–562 (Mar. 1992).

*0.98 $\mu$m Aluminum–Free In BaAs/InGaAsP/InGaP GRIN-SCH Lasers*, 6 pages.

S. Shimada et al., Optical Amplifiers and their Applications, Chapter 7.3 "*Optical Amplifiers*" and Chapter 8.3 "*Semiconductor Lasers for EDFA Pumping*", pp. 132–158 (1994).

B.S. Bhumba, Electronic Letters 26(21), "*High Power Operation of GaInAsP/GaInAs MQW Ridge Lasers Emitting at 1.48 $\mu$m*", pp. 1755–1756 (Oct. 1990).

* cited by examiner

US 5,845,030 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 14 is confirmed.

Claim 5 is cancelled.

Claims 1, 2, 6 and 8–13 are determined to be patentable as amended.

Claims 3, 4 and 7, dependent on an amended claim, are determined to be patentable.

New claims 15–45 are added and determined to be patentable.

1. A semiconductor laser module comprising:
   (a) a semiconductor laser having an active region between a light-reflecting surface and a light-exit surface thereof; and
   (b) an optical fiber optically coupled to said semiconductor laser and including an optical fiber diffraction grating, said optical fiber diffraction grating serving to selectively reflect light within a predetermined wavelength band,
   wherein the wavelength band has a width larger than a wavelength interval of a longitudinal mode of light resonating between said light-reflecting surface and said light-exit surface,
   *further comprising an antireflection coating having a reflectance of not more than 1% and formed on said light-exit surface of said semiconductor laser.*

2. A [module according to claim 1,] *semiconductor laser module comprising:*
   *(a) a semiconductor laser having an active region between a light-reflecting surface and a light-exit surface thereof; and*
   *(b) an optical fiber optically coupled to said semiconductor laser and including an optical fiber diffraction grating, said optical fiber diffraction grating serving to selectively reflect light within a predetermined wavelength band,*
   *wherein the wavelength band has a width larger than a wavelength interval of a longitudinal mode of light resonating between said light-reflecting surface and said light-exit surface,*
   further comprising:
   a package having said semiconductor laser arranged therein; and
   a Peltier element thermally connected to said semiconductor laser and arranged in said package.

6. A module according to claim [5] *1*, wherein said antireflection coating comprises a dielectric multilayer film.

8. A [module according to claim 1,] *semiconductor laser module comprising:*
   *(a) a semiconductor laser having an active region between a light-reflecting surface and a light-exit surface thereof; and*
   *(b) an optical fiber optically coupled to said semiconductor laser and including an optical fiber diffraction grating, said optical fiber diffraction grating serving to selectively reflect light within a predetermined wavelength band,*
   *wherein the wavelength band has a width larger than a wavelength interval of a longitudinal mode of light resonating between said light-reflecting surface and said light-exit surface,*
   wherein said semiconductor laser comprises a semiconductor laser for emitting light within a 1.48-$\mu$m band, and a width of said predetermined wavelength band of the light reflected by said optical fiber diffraction grating is 2 nm to 5 nm.

9. A [module according to claim 1,] *semiconductor laser module comprising:*
   *(a) a semiconductor laser having an active region between a light-reflecting surface and a light-exit surface thereof; and*
   *(b) an optical fiber optically coupled to said semiconductor laser and including an optical fiber diffraction grating, said optical fiber diffraction grating serving to selectively reflect light with a predetermined wavelength band,*
   *wherein the wavelength band has a width larger than a wavelength interval of a longitudinal mode of light resonating between said light-reflecting surface and said light-exit surface,*
   wherein an end portion of said optical fiber on said semiconductor laser side is substantially spherical.

10. A [module according to claim 1,] *semiconductor laser module comprising:*
    *(a) a semiconductor laser having an active region between a light-reflecting surface and a light-exit surface thereof; and*
    *(b) an optical fiber optically coupled to said semiconductor laser and including an optical fiber diffraction grating, said optical fiber diffraction grating serving to selectively reflect light within a predetermined wavelength band,*
    *wherein the wavelength band has a width larger than a wavelength interval of a longitudinal mode of light resonating between said light-reflecting surface and said light-exit surface,*
    wherein said optical fiber has a core with a diameter that increases toward said semiconductor laser.

11. *A semiconductor laser module, comprising:*
    *a semiconductor laser having an active region between a light-reflecting surface and a light-exit surface thereof;*
    *an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface* a package having said semiconductor laser arranged therein;

a Peltier element thermally connected to said semiconductor laser and arranged in said package;

a first lens arranged in said package to oppose said light-exit surface of said semiconductor laser; and a second lens arranged outside said package to oppose said first lens, wherein positions of said light-exit surface, said first lens, said second lens, and said optical fiber diffraction grating are fixed, wherein an antireflection coating having a reflectance of not more that 1% is formed on said light-exit surface of said semiconductor laser.

12. A [module according to claim 11,] *semiconductor laser module, comprising:*

*a semiconductor laser having an active region between a light-reflecting surface and a light-exit surface thereof;*

*an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface*

*a package having said semiconductor laser arranged therein;*

*a Peltier element thermally connected to said semiconductor laser and arranged in said package;*

*a first lens arranged in said package to oppose said light-exit surface of said semiconductor laser; and*

*a second lens arranged outside said package to oppose said first lens,*

*wherein positions of said light-exit surface, said first lens, said second lens, and said optical fiber diffraction grating are fixed,* further comprising a hermetic glass member formed in said package, said hermetic glass member being interposed between said semiconductor laser and said optical fiber difraction grating.

13. An optical fiber amplifier comprising:

a semiconductor laser module comprising:

(a) a semiconductor laser having an active region between a light-reflecting surface and a light-exit surface thereof; and (b) an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface an ebrium-doped fiber; and a wavelength multiplexer/demultiplexer for optically coupling said semiconductor laser and said erbium-doped fiber to each other through said optical fiber, wherein an antireflection coating having a reflectance of not more than 1% is formed on said light-exit surface of said semiconductor laser.

15. A module according to claim 1, further including cladding layers made of InP, and wherein said active region is made of InGaAsP formed between said cladding layers.

16. A module according to claim 1, wherein said semiconductor laser emits light within a 1.48-μm band.

17. A module according to claim 11, wherein said semiconductor laser emits light within a 1.48-μm band.

18. An amplifier according to claim 13, wherein said semiconductor laser emits light within a 1.48-μm band.

19. An amplifier according to claim 13, wherein said predetermined wavelength band is 2 nm to 5 nm.

20. An amplifier according to claim 14, further comprising an antireflection coating having a reflectance of not more than 1% and formed on said light-exit surface of said semiconductor laser.

21. *An optical fiber amplifier including a semiconductor laser module comprising:*

*(a) a semiconductor laser having an active region between a light-reflecting surface and a light-exit surface thereof;*

*(b) an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface,*

*wherein an antireflection coating having a reflectance of not more than 1% is formed on said light-exit surface of said semiconductor laser; and*

*(c) an erbium-doped fiber optically coupled to said semiconductor laser through said optical fiber.*

22. *An amplifier according to claim 21, wherein said semiconductor laser emits light within a 1.48-μm band.*

23. *An amplifier according to claim 21, wherein said predetermined wavelength band is 2 nm to 5 nm.*

24. *An amplifier according to claim 21, further including cladding layers comprising InP, and wherein said active region is made of InGaAsP and is formed between the cladding layers.*

25. *A semiconductor laser module comprising:*

*(a) a semiconductor laser having an active region between a light-reflecting surface and a light-exit surface thereof; and*

*(b) an optical fiber optically coupled to said semiconductor laser and including an optical fiber diffraction grating, said optical fiber diffraction grating serving to selectively reflect light within a predetermined wavelength band of 2 nm to 5 nm,*

*wherein the wavelength band has a width larger than a wavelength interval of a longitudinal mode of light resonating between said light-reflecting surface and said light-exit surface.*

26. *A module according to claim 25, further comprising a package having said semiconductor laser arranged therein; and a Peltier element thermally connected to said semiconductor laser and arranged in said package.*

27. *A module according to claim 26, further comprising a heat sink arranged between said Peltier element and said semiconductor laser and fixed to said Peltier element and said semiconductor laser.*

28. *A module according to claim 27, further comprising a first lens arranged to oppose said light-exit surface of said semiconductor laser, and wherein said heat sink has an opening located between said light-exit surface of said semiconductor laser and said first lens.*

29. *A module according to claim 25, further comprising an antireflection coating having a reflectance of not more* than 1% and formed on said light-exit surface of said semiconductor laser.

30. A module according to claim 29, wherein said antireflection coating comprises a dielectric nultilayer film.

31. A module according to claim 30, wherein said dielectric multilayer film contains at least two materials selected from the group consisting of $SiO_2$, $TiO_2$, SiN, $Al_2O_3$, $MgF_2$, and amorphous silicon.

32. A module according to claim 25, wherein an end portion of said optical fiber on said semiconductor laser side is substantially sperical.

33. A module according to claim 25, wherein said optical fiber has a core with a diameter that increases toward said semiconductor laser.

34. A module according to claim 25, further including cladding layers comprising InP, and wherein said active region is made of InGaAsP and is formed between the cladding layers.

35. A semiconductor laser module comprising:
   (a) a semiconductor laser having an active region between a light-reflecting surface and a light-exit surface thereof, said semiconductor laser emitting light within a 1.48-μm band; and
   (b) an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface.

36. A module according to claim 35, further comprising a package having said semiconductor laser arranged therein; and a Peltier element thermally connected to said semiconductor laser and arranged in said package.

37. A module according to claim 36, further comprising a heat sink arranged between said Peltier element and said semiconductor laser and fixed to said Peltier element and said semiconductor laser.

38. A module according to claim 37, further comprising a first lens arranged to oppose said light-exit surface of said semiconductor laser, and wherein said heat sink has an opening located between said light-exit surface of said semiconductor laser and said first lens.

39. A module according to claim 35, further comprising an antireflection coating having a reflectance of not more than 1% and formed on said light-exit surface of said semiconductor laser.

40. A module according to claim 39, wherein said antireflection coating comprises a dielectric multilayer film.

41. A module according to claim 40, wherein said dielectric multilayer film contains at least two materials selected from the group consisting of $SiO_2$, $TiO_2$, SiN, $Al_2O_3$, $MgF_2$, and amorphous silicon.

42. A module according to claim 35, further including cladding layers made of InP, and wherein said active region is made of InGaAsP formed between said cladding layers.

43. A semiconductor laser module, comprising:
   a semiconductor laser having an active region between a light-reflecting surface and a light-exit surface thereof, the laser emitting light in the 1.48 μm band;
   an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surfaces;
   a package having said semicondictor laser arranged therein;
   a Peltier element thermally connected to said semiconductor laser and arranged in said package;
   a first lens arranged in said package to oppose said light-exit surface of said semiconductor laser; and
   a second lens arranged outside said package to oppose said first lens,
   wherein positions of said light-exit surface, said first lens, said second lens, and said optical fiber diffraction grating are fixed.

44. A module according to claim 43, wherein a width of said predetermined wavelength band of the light reflected by said optical fiber diffraction grating is 2 nm to 5 nm.

45. An optical fiber amplifier comprising:
   a semiconductor laser module comprising:
   (a) a semiconductor laser having an active region between a light-reflecting surface and a light-exit surface thereof, the laser emitting light in the 1.48 μm band; and
   (b) an optical fiber optically coupled to said semiconductor laser and including an optical fiber diffraction grating, said optical fiber diffraction grating serving to selectively reflect light within a predetermined wavelength band, wherein the wavelength band has a width larger than a wavelength interval of a longitudinal mode of light resonating between said light-reflecting surface and said light-exit surface;
   an Ebrium-doped fiber; and
   a wavelength multiplexer/demultiplexer for optically coupling said semiconductor laser and said erbium-doped fiber to each other through said optical fiber.

* * * * *